United States Patent [19]

Kestler

[11] Patent Number: 4,644,282

[45] Date of Patent: Feb. 17, 1987

[54] APPARATUS FOR THE FORMATION OF IMAGES OF AN EXAMINATION SUBJECT WITH NUCLEAR MAGNETIC RESONANCE

[75] Inventor: Joachim Kestler, Pretzfeld, Fed. Rep. of Germany

[73] Assignee: Siemens Aktiengesellschaft, Berlin and Munich, Fed. Rep. of Germany

[21] Appl. No.: 613,355

[22] Filed: May 23, 1984

[30] Foreign Application Priority Data

Oct. 5, 1983 [DE] Fed. Rep. of Germany ....... 3335286

[51] Int. Cl.$^4$ ........................ G01R 33/20; H03K 3/53
[52] U.S. Cl. .................................... 324/322; 324/318
[58] Field of Search .............. 324/300, 307, 309, 318, 324/319, 320, 322, 313; 328/67; 307/263, 264, 268; 377/101

[56] References Cited

U.S. PATENT DOCUMENTS

| | | | |
|---|---|---|---|
| 3,553,592 | 1/1971 | Ahrweiller | 328/67 |
| 4,437,053 | 3/1984 | Bax | 323/268 |
| 4,509,015 | 4/1985 | Ordidge et al. | 324/307 |
| 4,568,880 | 2/1986 | Sugimoto | 324/309 |

FOREIGN PATENT DOCUMENTS 0834871 6/1981 U.S.S.R. ............................. 324/322

OTHER PUBLICATIONS

Bangerter, B., A Simple Pulsed Field Gradient Circuit for High Resolution NMR Spectrometers, J. of Mag. Res., vol. 13, No. 1, Jan. 1974, pp. 87–93.

"Possible & Limitations of NMR Imaging", Loeffler et al., Electromedica 2/82, pp. 38–40.

"Nuclear Magnetic Resonance Tomography (NMR Tomography) & Its Clinical Application Possibilities", Zeitler et al., Electromidica 3/81, pp. 134–143.

Primary Examiner—Stephen A. Kreitman
Assistant Examiner—Scott M. Oldham
Attorney, Agent, or Firm—Hill, Van Santen, Steadman & Simpson

[57] ABSTRACT

Magnetic fields are applied to the examination subject, and the deflection of the atomic nuclei of the examination subject from their state of equilibrium by means of a high frequency magnetic excitation pulse is detected. There is at least one gradient coil for the purpose of generating a linear magnetic field gradient. The gradient coil is connected, in series with an additional inductance, to a current source. Connected in series with the gradient coil is a first switch. Connected in parallel with the series of connection of gradient coil and first switch is a second switch actuatable to open condition approximately simultaneously with the closure of the first switch.

2 Claims, 5 Drawing Figures

APPARATUS FOR THE FORMATION OF IMAGES OF AN EXAMINATION SUBJECT WITH NUCLEAR MAGNETIC RESONANCE

BACKGROUND OF THE INVENTION

The invention relates to an apparatus for the formation of images of an examination subject with nucelar magnetic resonance, wherein means are present for the application of magnetic fields to the examination subject and for the detection of the deflection of the atomic nuclei of the examination subject from the equilibrium state by means of a high frequency magnetic excitation pulse, whereby the means for the application of magnetic fields includes at least one gradient coil for the generation of a linear magnetic field gradient.

It is known that it is possible to deflect, in particular, the hydrogen atomic nuclei of an examination subject from a preferred direction, which is established by a basic magnetic field, by means of a high frequency excitation pulse, and that the atomic nuclei, after the end of the excitation pulse, due to their spin, swing into the preferred direction again only after a certain time. During this time, the atomic nuclei precess with a frequency which is dependent upon the intensity of the basic magnetic field. If a field gradient is superimposed on a homogenous basic magnetic field so that the magnetic field distribution varies spatially, then a position selection via the respective measured frequency is possible. It is also known that, in this manner and through alteration of the direction of the field gradient, it is possible to prepare tomographic images of the examination subject. The excitation in a layer of the examination subject thus proceeds in that the basic magnetic field is influenced by an additional field gradient such that an excitation of the atomic nuclei takes place only in this layer. This is possible because the excitation proceeds only with the frequency which is strictly associated with the magnetic field in the desired layer.

In the gradient coils for the generation of the field gradient, in practice, coil currents occur in the range of five amperes to 300 amperes which must be capable of being relatively rapidly switched on and off. In order that no image interferences occur, the current pulses in the gradient coils must exhibit a precisely specified shape (flat top) and a reproducible rise and fall as a function of time at the switching transitions; for example, a substantially rectangular waveform as a function of time.

Background concerning the operation of nuclear magnetic resonance equipment is found in an article by Zeitler et al "Nuclear Magnetic Resonance Tomography (NMR Tomography) and Its Clinical Application Possiblities", Electromedica (English Edition) No. 3, 1981, pages 134–143, and in an article by Loeffler and Oppelt "Possibilities and Limitations of NMR Imaging", Electromedica (English Edition), No. 2, 1982, pages 38–40.

SUMMARY OF THE INVENTION

The object underlying the invention resides in developing an apparatus of the type initially cited such that the above-described demands regarding the current pulses in the gradient coils can be met in a simple fashion.

In accordance with the invention this objective is achieved in that the gradient coil is connected in series with an additional inductance, and that a first switch is connected in series with the gradient coil, and a second switch, actuatable approximately simultaneously with the first switch, is connected parallel to this series connection. The concept which underlies the invention is to generate the overexcitation, necessary for a rapid current rise in the gradient coil, by virtue of the fact that the high voltage briefly necessary for this purpose is taken from a current-carrying inductance.

The invention shall be explained in greater detail in the following on the basis of an exemplary embodiment illustrated on the accompanying drawing sheets; and other objects, features and advantages will be apparent from this detailed disclosure and from the appended claims.

DETAILED DESCRIPTION

Figure 1:
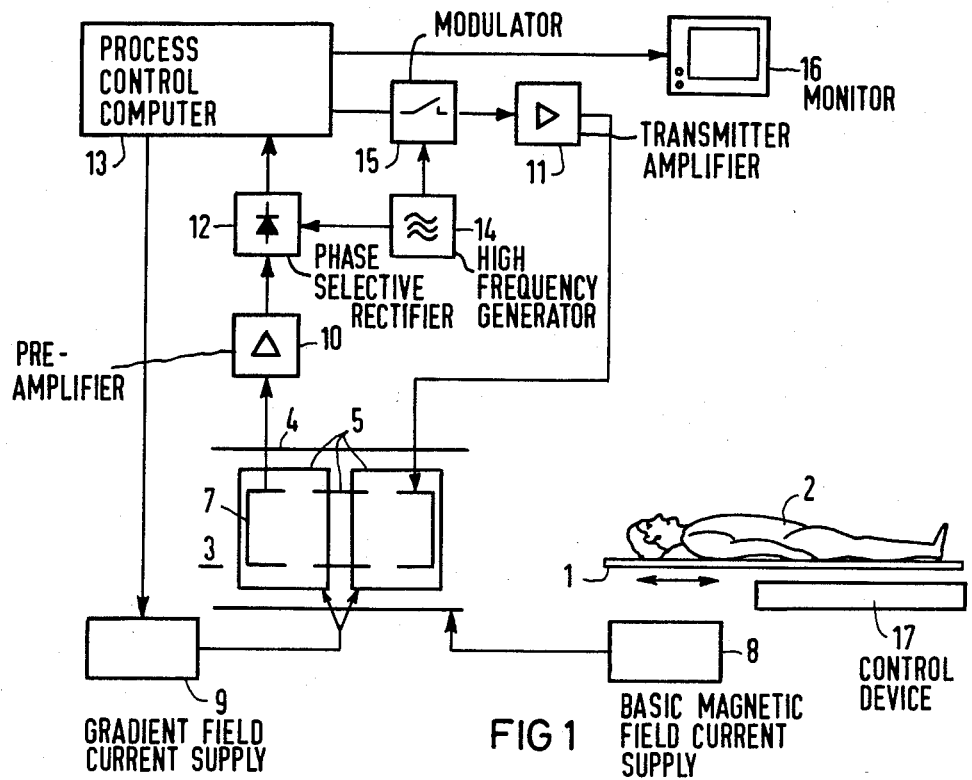
FIG. 1 shows an apparatus for the formation of images of an examination subject with nuclear magnetic resonance.

In FIG. 1, a support 1 is illustrated on which a patient 2 is lying of whom images are to be formed with the aid of nuclear magnetic resonance. For this purpose, a coil system 3 is present including a coil 4 for the generation of a homogenous basic magnetic field, gradient coils 5 for the purpose of varying said basic magnetic field, and an excitation and measuring coil 7. The coil 4 is connected to a basic magnetic field current supply 8, the gradient coils 5 are connected to a gradient field current supply 9, and the excitation and measuring coil 7 is connected to a preamplifier 10, and, for purposes of excitation, to a transmitter amplifier 11. The preamplifier 10 supplies the measurement signal, via a phase-selective rectifier 12, to a process control computer 13 which controls the entire measurement operation. Serving the purpose of generating an excitation pulse is a high frequency oscillator 14 which is connectible via a modulator 15 to the transmitter amplifier 11. The display of the formed images takes place on a monitor 16.

For the formation of an image of the patient 2, with the aid of nuclear magnetic resonance, the support 1 is inserted, with the aid of a control device 17, which is likewise activated by the process control computer 13, into the coil system 3 in such a fashion that a specific layer of the patient 2 is so disposed that, due to the generated magnetic field, nuclear resonance is stimulated therein by means of an excitation pulse in the coil 7. From the measurement signal, likewise picked up with the aid of the coil 7, data are created from which an image of the stimulated layer can be calculated and reproduced on the monitor 16. For the purpose of image formation an alteration of the field gradient, and hence a switching-on and-off of the gradient coils 5, is necessary.

Figure 2:
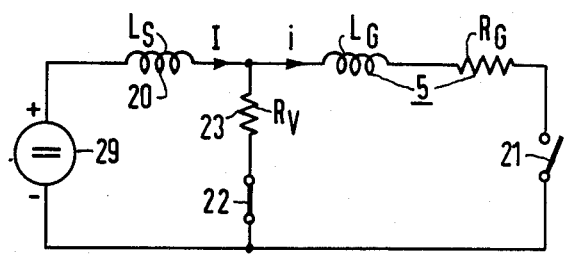
FIG. 2 shows a circuit for the generation of the desired current waveform as a function of time in a gradient coil.

In FIG. 2, a circuit is illustrated for the purpose of current supply of a gradient coil 5. As an equivalent circuit representation of the gradient coil 5, the inductance $L_G$ and the ohmic resistance $R_G$ are illustrated. The gradient coil 5 is connected, in series with an additional inductance 20, to direct current source 29. Connected in series with the gradient coil 5 is a first switch 21, and parallel to this series circuit 5, 21, a switch 22 is arranged which is connected in series with an ohmic resistance 23. The additional inductance 20 has the inductance $L_S$ and the resistance 23 has the ohmic resistance value $R_V$. The resistance value $R_V$ is preferably selected to be equally as great as the resistance $R_G$ of the gradient coil 5.

The gradient current i is switched on through closing of the switch 21 and simultaneous opening of the switch 22. The energy stored in the additional inductance 20 upon switching-over is distributed between the two inductances $L_S$ and $L_G$, whereby the voltage peak necessary for the purpose of overexcitation of the gradient coil 5 results.

For the gradient current $i_o$, immediately after the switching-over there results:

$$i_o = I \times \frac{L_S}{L_S + L_G}$$

Figure 3:
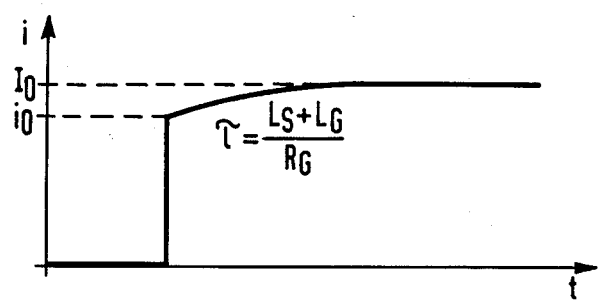
FIGS. 3 and 4 show curves for the purpose of explaining FIG. 2.

The current waveform is illustrated in FIG. 3. The departure of the current from an ideal flat topped waveform as a function of time can be essentially avoided by the following steps:

If $L_S$ is made substantially greater than $L_G$, then $i_o$ tends to reach the maximum current value $I_o$ more rapidly. Moreover, $R_V$ can be selected somewhat smaller than $R_G$, so that the current I through $L_S$, prior to the switching-over, is greater by the necessary amount; for example, $R_V$ can be selected so that the following equation is satisfied:

$$\frac{R_V}{R_G} = \frac{L_S}{L_S + L_G}$$

Figure 4:
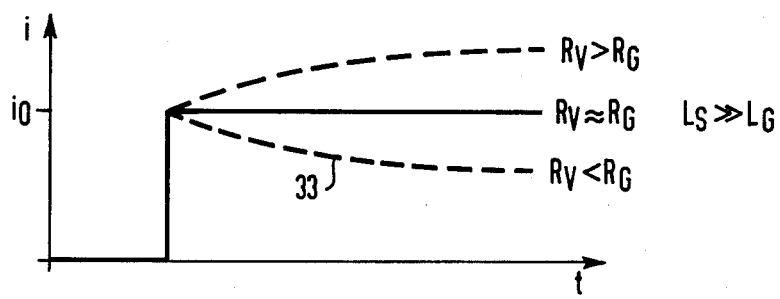

With the value of $L_S$ substantially greater than $L_G$, and by the selection of the series resistance $R_V$ it is thus possible to vary the chronological current progression within certain boundaries (as indicated by the dash lines in FIG. 4); the time constant $\tau$ for the various dash line curves in FIG. 4 is adjustable via $L_S$:

$$\tau = \frac{L_S + L_G}{R_G}$$

In this manner, also an eddy current compensation can be carried out.

The disconnection of the gradient current is executed through opening of the switch 21 and simultaneous closing of the switch 22. Thus, a voltage peak results at the switch 21 which is necessary for a rapid field reduction in $L_G$.

Figure 5:
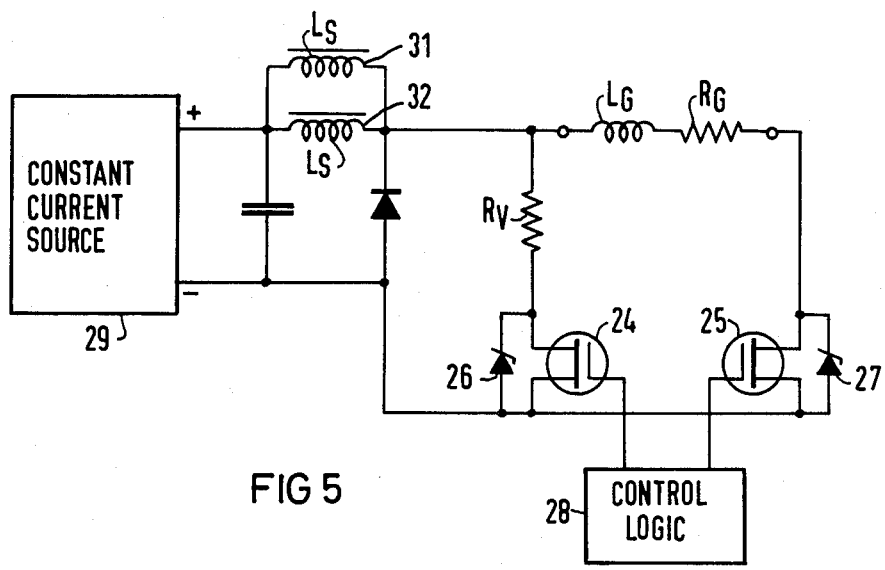
FIG. 5 shows a more detailed circuit diagram for the purpose of current supply of a gradient coil.

In the embodiment of FIG. 5, to achieve improved thermal and chronological stability of the pulse amplitude, a constant current source is used as the current source 29. As switches, transistors 24, 25, are selected; the parallel-connected Zener diodes 26, 27, limit the voltage peak upon connection and disconnection of the gradient current, which renders possible a sufficiently rapid rise and drop of the current. The activation of the transistors 24, 25, proceeds by means of a control logic 28. The inductance 20 of FIG. 2 is split into two parallel inductances 31 and 32 in FIG. 5.

It will be apparent that many modifications and variations may be made without departing from the scope of the teachings and concepts of the present invention.

I claim as my invention:

1. In an apparatus for forming images of an examination subject by nuclear magnetic resonance having means for generating a fundamental magnetic field and means including at least one gradient coil for generating a linear magnetic field gradient in which said examination subject is disposed, means for applying a high frequency magnetic excitation pulse to the examination subject, and means for detecting deflection of the atomic nuclei of the examination subject from their equilibrium state as a result of said high frequency magnetic excitation pulse, the improvement comprising:

a dc current source having first and second poles;

an additional inductance having a first lead connected to said first pole of said current source;

a first switch connected in series with said gradient coil forming a series circuit, said series circuit being connected between a second lead of said additional inductance and said second pole of said current source; and a second switch connected in parallel with said series circuit, said second switch being opened substantially simultaneously with the closing of said first switch for initiating rapid current increase in said gradient coil.

2. The improvement of claim 1 further comprising, an ohmic resistance connected in series with said second switch forming a second series circuit in parallel with the series circuit formed by the gradient coil and the first switch.

* * * * *